United States Patent
Zhu et al.

(10) Patent No.: US 11,647,585 B2
(45) Date of Patent: May 9, 2023

(54) FLEXIBLE PRINTED CIRCUIT FOR BRIDGING AND DISPLAY PANEL

(71) Applicants: Chengdu BOE Optoelectronics Technology Co., Ltd., Chengdu (CN); BOE Technology Group Co., Ltd., Beijing (CN)

(72) Inventors: Xiaolong Zhu, Beijing (CN); Hengzhen Liang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/356,349

(22) Filed: Jun. 23, 2021

(65) Prior Publication Data
US 2022/0159833 A1 May 19, 2022

(30) Foreign Application Priority Data
Nov. 19, 2020 (CN) .......................... 202022696717.8

(51) Int. Cl.
*H05K 1/11* (2006.01)
*H05K 1/02* (2006.01)
*H05K 1/14* (2006.01)
*G06F 3/041* (2006.01)

(52) U.S. Cl.
CPC ............. *H05K 1/115* (2013.01); *H05K 1/028* (2013.01); *H05K 1/147* (2013.01); *G06F 3/041* (2013.01); *H05K 2201/09545* (2013.01); *H05K 2201/09572* (2013.01); *H05K 2201/10128* (2013.01)

(58) Field of Classification Search
CPC ........ H05K 1/115; H05K 1/028; H05K 1/147; H05K 1/116; H05K 1/111; H05K 2201/09545; H05K 2201/09572; H05K 2201/10128; H05K 2201/09036; H05K 2201/09809; H05K 2201/09063; H05K 3/321; G06F 3/041; G06F 3/04164; H01L 2224/27013; H01L 2224/83051
See application file for complete search history.

(56) References Cited

U.S. PATENT DOCUMENTS 3,610,811 A * 10/1971 O'Keefe ............... H05K 3/3452
439/55
2016/0037638 A1* 2/2016 Inamori ................ H05K 1/116
174/254
2018/0343748 A1* 11/2018 Hirano ................... H05K 3/306

* cited by examiner

*Primary Examiner* — Roshn K Varghese
(74) *Attorney, Agent, or Firm* — IPro, PLLC

(57) ABSTRACT

A flexible printed circuit for bridging is provided. The flexible printed circuit has at least one via, at least one overflow groove is provided at a first distance from an edge of the via, and the overflow groove is provided in a cover layer on a side of a soldering surface of the flexible printed circuit.

15 Claims, 4 Drawing Sheets

FLEXIBLE PRINTED CIRCUIT FOR BRIDGING AND DISPLAY PANEL

The present application claims a priority to Chinese Patent Application No. 202022696717.8 filed in China on Nov. 19, 2020, which is incorporated herein by reference in its entirety.

TECHNICAL FIELD

The present disclosure relates to the technical field of display device fabrication, and more particularly, to a flexible printed circuit for bridging and a display panel.

BACKGROUND

On cell refers to a method of embedding a touch screen between a color filter substrate and a polarizer of a display screen, i.e., providing a touch sensor (touch) on a liquid crystal panel (panel). When implementing the touch on panel, the trace of touch layer and the trace of panel layer are usually arranged on the same MFPC (Main Flexible Printed Circuit).

SUMMARY

Some embodiments of the present disclosure provide a flexible printed circuit for bridging, the flexible printed circuit has at least one via, at least one overflow groove is provided at a first distance from an edge of the via, and the overflow groove is provided in a cover layer on a side of a soldering surface of the flexible printed circuit.

In some embodiments, the overflow groove is an annular groove, and a distance between a first point on an inner ring edge of the annular groove and a second point on the edge of the via that is closest to the first point is the first distance.

In some embodiments, the first distance is greater than or equal to 0.3 mm.

In some embodiments, the overflow groove has a groove width of at least 0.2 mm.

In some embodiments, a first copper plating layer is provided on a side of the cover layer that is away from the soldering surface.

In some embodiments, a groove depth of the overflow groove is the same as a thickness of the cover layer, and a groove bottom of the overflow groove is the first copper plating layer.

In some embodiments, a groove depth of the overflow groove is less than a thickness of the cover layer, a second copper plating layer is provided on a groove bottom of the overflow groove and a groove wall of the overflow groove that is close to the via, and the second copper plating layer is connected to the first copper plating layer.

In some embodiments, a third copper plating layer is provided on an inner wall of the via, and the third copper plating layer is connected to the first copper plating layer.

In some embodiments, a cross-sectional shape of the overflow groove is any one of: a rectangle, a trapezoid, or an arc shape.

In some embodiments, the via is circular in shape and the overflow groove is an annular overflow groove having a same center as the circular via.

In some embodiments the via is square in shape and the overflow groove is a linear overflow groove or a square ring.

Some embodiments of the present disclosure also provide a display panel including a main flexible printed circuit and the flexible printed circuit for bridging described above. The main flexible printed circuit is connected to the flexible printed circuit for bridging through the via, and the via and the overflow groove are provided with a soldering material.

BRIEF DESCRIPTION OF THE DRAWINGS

In order to more clearly illustrate the technical solutions of embodiments of the present disclosure or the related technologies, a brief description will be given below with reference to the accompanying drawings, which are required to be used in the description of the embodiments or the related technologies. It is apparent that the drawings in the description below are only some embodiments described in the present disclosure. For a person of ordinary skill in the art, other drawings can also be obtained according to these drawings without involving any creative efforts.

DETAILED DESCRIPTION

Figure 1:
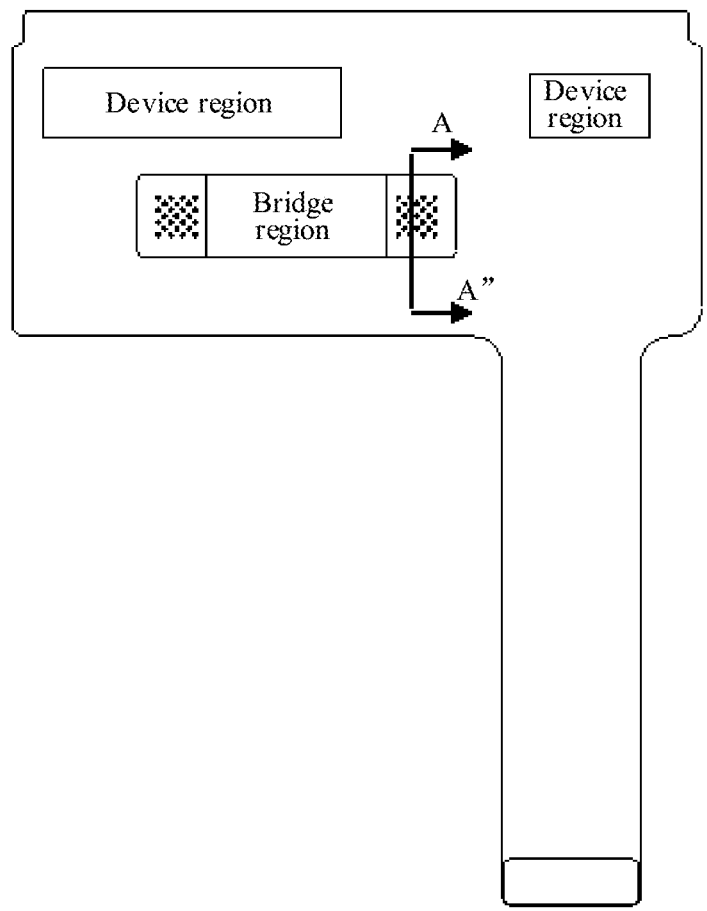
FIG. 1 is a schematic diagram of bridging between an FPC and an MFPC in the related technologies.

Various aspects and features of the disclosure are described herein with reference to the drawings.

It should be understood that various modifications may be made to the embodiments disclosed herein. Accordingly, the above description should not be taken as limiting, but merely as exemplifications of the embodiments. Other modifications within the scope and spirit of the disclosure will occur to those skilled in the art.

The accompanying drawings, which are incorporated in and constitute a part of this specification, illustrate embodiments of the disclosure and, together with a general description of the disclosure given above, and the detailed description of the embodiments given below, serve to explain the principles of the disclosure.

These and other features of the present disclosure will become apparent from the following description of embodiments, given as non-limiting examples, with reference to the accompanying drawings.

It should also be understood that while the present disclosure has been described with reference to certain specific examples, those skilled in the art will be able to ascertain many equivalents of the disclosure, and they have the features as provided in the appended claims and thus fall within the protection scope of the appended claims.

The above and other aspects, features and advantages of the present disclosure will become more apparent in view of the following detailed description when taken in conjunction with the accompanying drawings.

Specific embodiments of the present disclosure will be described with reference to the accompanying drawings. It should be understood, however, that the embodiments disclosed are merely exemplary of the disclosure, which can be embodied in various forms. Well-known and/or iterative functions and structures have not been described in detail to prevent unnecessarily or needless details from obscuring the present disclosure. Therefore, specific structural and functional details disclosed herein are not to be interpreted as limiting, but merely as a basis for the claims and as a representative basis for teaching one skilled in the art to variously employ the present disclosure in virtually any appropriately detailed structure.

The description may use the phrases "in one embodiment", "in another embodiment", "in yet another embodiment", or "in other embodiments", which may refer to one or more of the same or different embodiments of the present disclosure.

When implementing the touch on panel, the trace of the touch layer and the trace of the panel layer are usually arranged on the same MFPC. However, the trace of the panel layer and the trace of the touch layer may cause interference at the intersection, affecting the use effect of the display panel. In order to address the problem of interference at the intersection, in the related technologies, the trace of the touch layer is led out from an end of the intersection of the MFPC, and the trace is connected to other end by bridging via an FPC (Flexible Printed Circuit) for bridging, to avoid interference caused by direct intersecting of the touch trace and the panel trace in the MFPC.

Figure 2:
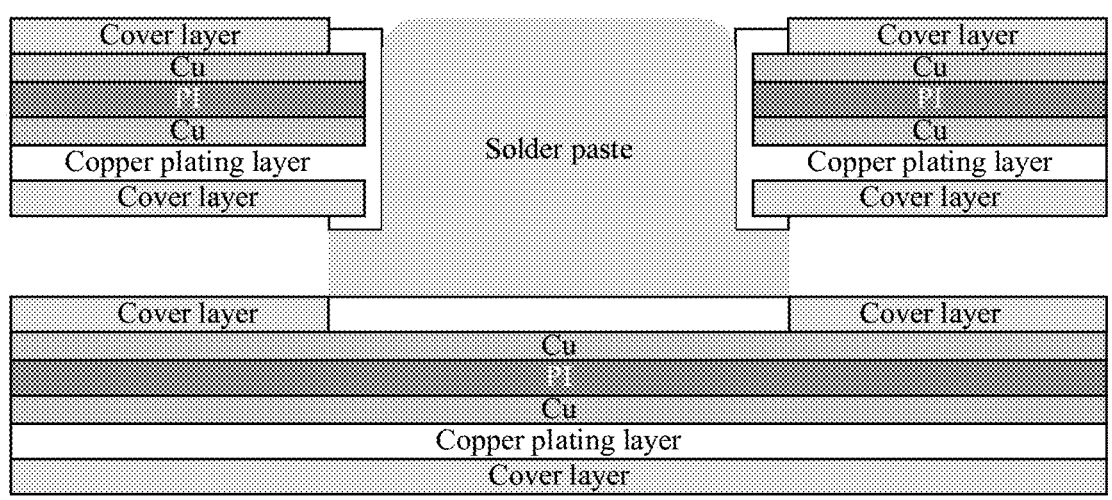
FIG. 2 is a schematic cross-sectional view of AA' in FIG. 1.

FIG. 1 shows a schematic diagram of bridging between an FPC and an MFPC in the related technologies. As shown in FIG. 1, two ends of the FPC are provided with via regions for soldering with the bottom MFPC. FIG. 2 is a schematic cross-sectional view of AA' in FIG. 1. The FPC has a via therein, and the FPC and the MFPC are connected by filling the via with solder paste and performing a soldering operation at the via. However, when providing the solder paste, if the amount of the solder paste is too small, it is easy to cause an insufficient connection at the soldering position and it is easy to cause a soldering disconnection during the use of the FPC, which results in a disconnection of the trace of the touch layer; if the amount of the solder paste is too large, it is easy for the solder paste to overflow from the via, forming an inter-pad short circuit.

To address the above-mentioned problem of the insufficient connection or the inter-pad short circuit which may be caused by different amounts of solder paste when bridging the FPC and the MFPC, the FPC structure for bridging is improved in some embodiments of the present disclosure. FIG. 2 shows a schematic cross-sectional view of an FPC via region in the related technologies. Based on FIG. 2, it can be seen that a cover layer is provided on a side of a first copper plating layer that is close to a soldering surface, for achieving the functions of insulation, solder blocking and protection. An inner wall of the via is provided with a third copper plating layer completely surrounding the inner wall of the via, which may be used as a solder pad to connected to the solder. It should be noted that the third copper plating layer is also provided on an edge portion of the cover layer on a side of the soldering surface, where the edge portion is close to the via, and the third copper plating layer is connected with the first copper plating layer, which has functions of enlarging the soldering area and stabilizing the soldering effect.

Figure 3:
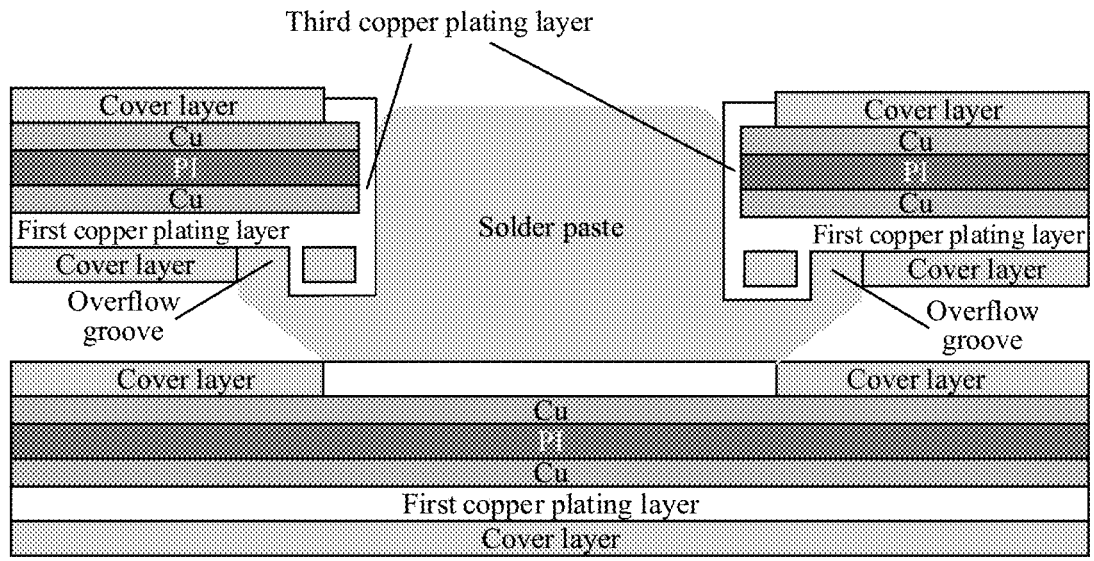
FIG. 3 is a schematic cross-sectional view of an FPC via region in some embodiments of the present disclosure.

On the basis of the FPC structure shown in FIG. 2, in some embodiments of the present disclosure, an overflow groove is provided in the cover layer on a side of the soldering surface, which is used for containing excess solder paste overflowing from the via. Specifically, the soldering surface of the flexible printed circuit, and the cover layer where the overflow groove is arranged are on the same side of the FPC. FIG. 3 shows a schematic cross-sectional view of an FPC via region provided with an overflow groove in some embodiments of the present disclosure. In particular, the overflow groove is provided at a first distance from the edge of the via, and the number of overflow groove may be one or more. The first distance may be a preset distance. The specific arrangement location of the overflow groove and the shape of the overflow groove may be determined based on the number of vias, the size of vias, and the shape of vias in the via region of the FPC board.

Figure 4:
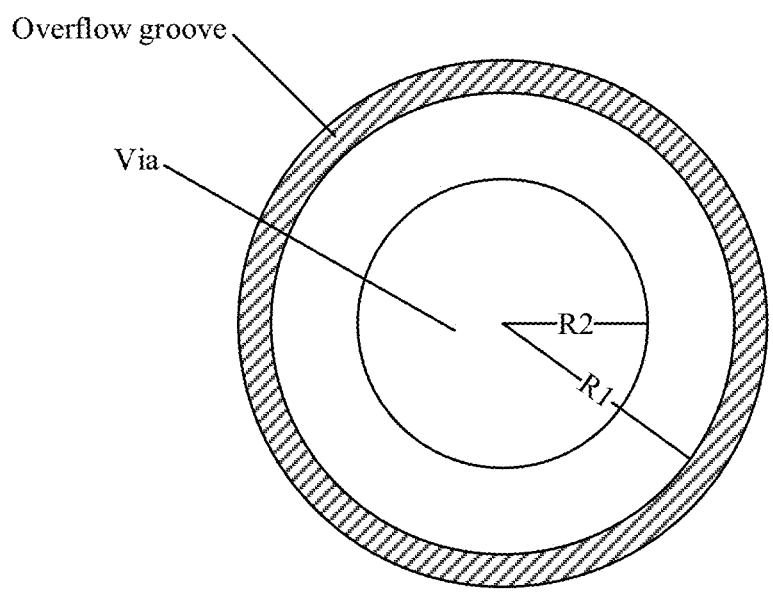
FIG. 4 is a schematic diagram of arrangement of a via and an overflow groove in some embodiments of the present disclosure.
Figure 5:
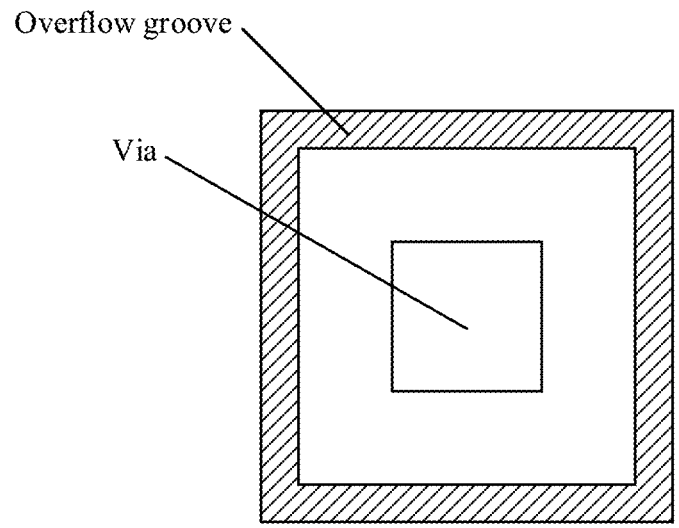
FIG. 5 is a schematic diagram of arrangement of a via and an overflow groove in some embodiments of the present disclosure.

Generally, the via is circular or rectangular in shape. When it is circular, the overflow groove may be an annular overflow groove having the same center as the circular via. As shown in FIG. 4, the shaded portion is the annular overflow groove. In this case, the radius R1 of the inner ring of the overflow groove needs to be greater than the radius R2 of the circular via, and the radius difference therebetween is the preset distance. When the via is rectangular in shape, more specifically, such as being square, the overflow groove may be a linear overflow groove, which may be correspondingly arranged at the preset distance from any edge of the square via, and may be arranged in a direction parallel to the edge of the via; or, two overflow grooves may be provided and the two overflow grooves are arranged outside two opposite edges of the square via. The overflow groove may be arranged to have a ring shape, as shown in FIG. 5 where it forms a square ring, and it is shown by the shaded portion of FIG. 5. It is ensured that the distance between any first point on the inner ring edge and a second point on the edge of the via that is closest to the first point is the preset distance. It should be noted that the dimension of the via and the dimension of the overflow groove shown in FIGS. 4 and 5 are schematic, and the dimension of the via or the overflow groove and the preset distance therebetween may be adjusted according to actual situations in actual manufacture. For example, in some embodiments, the shape of the via may be circular, and the overflow groove may be provided as a square ring, where a center of the square ring is the same as the center of the circular via, and embodiments of the present disclosure are not limited thereto.

In some embodiments, in order to ensure the soldering effect when the FPC and the MFPC are connected by bridging, the value of the preset distance in the embodiments may be set to be at least 0.3 mm, and the outer side of the cover layer corresponding to the preset distance has the third copper plating layer, as shown in FIG. 3. In the process of the solder overflowing into the overflow groove after filling the via, the solder going past this part of copper plating layer is equivalent to being fixed with the pad, thereby increasing the soldering area and improving the soldering effect. It should be noted that the lower limit of the preset distance is 0.3 mm, and the upper limit thereof may be determined according to the dimension of the via region in the FPC and the distance between the vias, so as to ensure that there are certain distances among adjacent vias and corresponding overflow grooves.

The cross-sectional shape of the overflow groove shown in FIG. 3 is rectangular. When actually manufacturing the overflow groove, the cross-sectional shape of the overflow groove may be set as a trapezoid, an arc shape or other geometric shapes, etc. For the convenience of manufacturing, the cross-sectional shape of the overflow groove is generally set to be rectangular.

Figure 6:
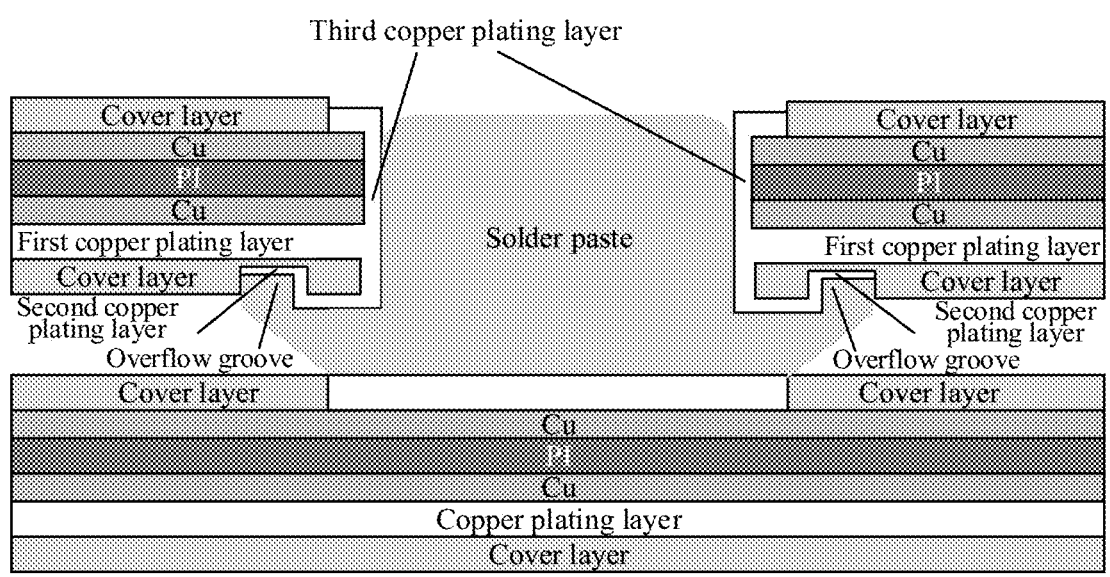
FIG. 6 is a schematic cross-sectional view of an FPC via region in some embodiments of the present disclosure.
Figure 7:
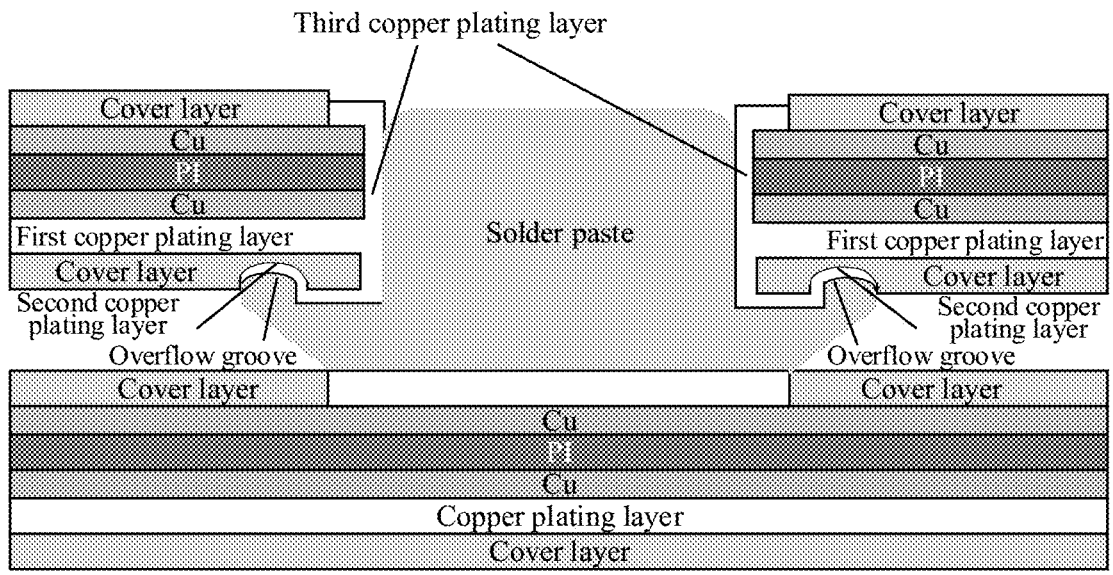
FIG. 7 is a schematic cross-sectional view of an FPC via region in some embodiments of the present disclosure.

In order to meet the requirement for containing the overflowed solder paste, the groove width and the groove depth of the overflow groove in the embodiments of the present disclosure may have at least the following limitations: the groove width of the overflow groove is at least 0.2 mm, and the groove depth of the overflow groove may be less than or equal to the thickness of the cover layer. When the groove depth is less than the thickness of the cover layer, it at least needs to be ensured that the overflow groove has a certain depth. In some embodiments, as shown in FIG. 3, the groove depth of the overflow groove is the same as the thickness of the cover layer, namely, the overflow groove penetrates the cover layer, and the surface of the first copper plating layer adjacent to the cover layer is used as the groove bottom of the overflow groove. In this way, the solder paste directly contacts the first copper plating layer when it overflows to the overflow groove, thus increasing the soldering area and improving the soldering effect. FIG. 6 shows a schematic cross-sectional view of the FPC via region in some embodiments, in which the groove depth of the overflow groove is less than the thickness of the cover layer. In this case, it is needed to consider the fixing effect of the overflowed solder paste while ensuring the containing effect of the overflow groove. Therefore, a second copper plating layer is provided on the groove bottom of the overflow groove and the groove wall of the overflow groove on the side close to the via, and the second copper plating layer is used as a soldering pad to cause the solder paste overflowing to the overflow groove to be fixed on the second copper plating layer after solidifying, which further improves the soldering effect. The first copper plating layer is connected to the second copper plating layer, and reference can be made to the manner shown in FIG. 6 in which the connection is implemented via the third copper plating layer on the inner wall of the via. As shown in FIG. 7, in some embodiments of the present disclosure, the cross-section of the overflow groove may be set as an arc shape.

In the embodiments of the present disclosure, by providing the overflow groove around the via on a side of the soldering surface of the FPC, it can be ensured for the process of soldering the bridge FPC that: in a case that a sufficient amount of solder paste is added into the via, after the solder paste melts and fills the position of the via, the excess solder paste may overflow to the position of the overflow groove. This avoids inter-pad short circuit caused by excess solder paste; in addition, it is ensured that there is enough solder to guarantee the connection effect between the FPC and the MFPC, and no insufficient connection may occur.

Some embodiments of the present disclosure also provide a display panel, which includes a main flexible printed circuit and the flexible printed circuit for bridging described above. The main flexible printed circuit is connected to the flexible printed circuit for bridging through the via, and the via and the overflow groove are filled with a soldering material.

Figure 8:
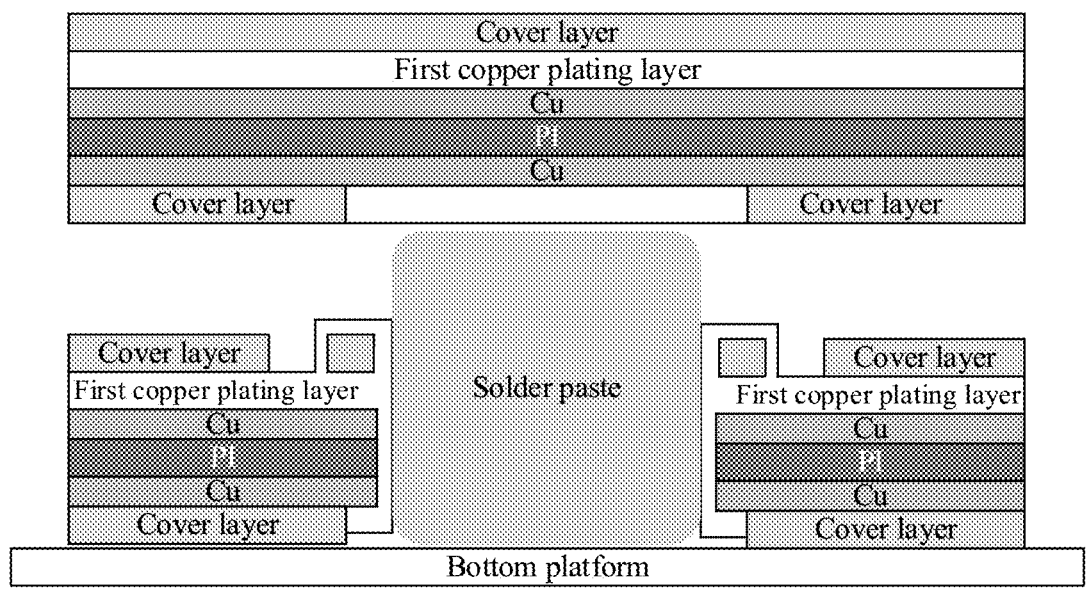
FIG. 8 is a schematic diagram of soldering of an FPC and an MFPC in some embodiments of the present disclosure.

The soldering process between the FPC and the MFPC provided by some embodiments of the present disclosure will be described in detail with reference to FIG. 8. The FPC is placed on a flat bottom platform, and the side with the overflow groove is placed upwards. Then a sufficient amount of solder paste is filled in the via of the FPC, and after the position of the pad in the MFPC corresponds to the position of the via, the MFPC is pressed towards the side of the bottom platform. After reflow soldering, the solder paste placed in the via melts, after it fills the via, the excess solder paste overflows into the overflow groove. After solidification, a stable solder connection between the FPC and the MFPC is formed. With the FPC provided in the embodiments, a sufficient amount of solder paste can be provided in the via when performing fill based on the solder paste, which mainly guarantees a sufficient amount of solder paste to realize the connection between the FPC and the MFPC and prevents the cold solder joint from affecting the connection effect of the traces. In addition, the excess solder paste can overflow to the overflow groove for containing, so as to avoid inter-pad short circuit caused by the excess solder paste; and there is a copper plating layer in the overflow groove, which can be used as a solder pad for being fixed to the solder paste, thereby increasing the soldering area, further improving the soldering effect, and ensuring the connection strength between the FPC and the MFPC. It is to be understood that in the above embodiments of the present disclosure, the soldering material is exemplified with the solder paste, but the present disclosure is not limited thereto.

Unless otherwise defined, the technical or scientific terms used in the present disclosure shall have the common meanings understood by those of ordinary skill in the art to which the present disclosure belongs. The terms "first", "second", and the like used in the present disclosure do not indicate any order, quantity, or importance, but are only used to distinguish different components. Word such as "including" or "having" means that the element or item listed before the word covers the element or item listed after the word and the equivalent thereof without excluding other elements or items. "Up", "down", "left", "right", etc., are only used to indicate the relative position relationship. When the absolute position of the described object changes, the relative position relationship may change accordingly. It can be understood that when an element such as a layer, film, region, or substrate is referred to as being "on" or "under" another element, the element may be "directly" on or "under" the another element, or there may be an intermediate element.

Although various embodiments of the present disclosure have been described in detail above, the present disclosure is not limited to these specific embodiments, and those skilled in the art can make various changes and modifications of the embodiments based on the concept of the present disclosure. These variations and modifications fall within the protection scope of the present disclosure as claimed.

What is claimed is:

1. A flexible printed circuit for bridging, wherein the flexible printed circuit has at least one via, at least one overflow groove is provided at a first distance from an edge of the via, and the overflow groove is provided in a cover layer on a side of a soldering surface of the flexible printed circuit;

wherein a first copper plating layer is provided on a side of the cover layer that is away from the soldering surface;

wherein a groove depth of the overflow groove is less than a thickness of the cover layer, a second copper plating layer is provided on a groove bottom of the overflow groove and a groove wall of the overflow groove that is close to the via, and the second copper plating layer is connected to the first copper plating layer.

2. The flexible printed circuit of claim 1, wherein the overflow groove is an annular groove, and a distance between a first point on an inner ring edge of the annular groove and a second point on the edge of the via that is closest to the first point is the first distance.

3. The flexible printed circuit of claim 1, wherein the first distance is greater than or equal to 0.3 mm.

4. The flexible printed circuit of claim 1, wherein the overflow groove has a groove width of at least 0.2 mm.

5. The flexible printed circuit of claim 1, wherein a third copper plating layer is provided on an inner wall of the via, and the third copper plating layer is connected to the first copper plating layer.

6. The flexible printed circuit of claim 1, wherein a cross-sectional shape of the overflow groove is any one of: a rectangle, a trapezoid, or an arc shape.

7. The flexible printed circuit of claim 1, wherein the via is circular in shape and the overflow groove is an annular overflow groove having a same center as the circular via.

8. The flexible printed circuit of claim 1, wherein the via is square in shape and the overflow groove is a linear overflow groove or a square ring.

9. A display panel, comprising a main flexible printed circuit and a flexible printed circuit for bridging, wherein the flexible printed circuit for bridging has at least one via, at least one overflow groove is provided at a first distance from an edge of the via, the overflow groove is provided in a cover layer on a side of a soldering surface of the flexible printed circuit for bridging, the main flexible printed circuit is connected to the flexible printed circuit through the via, and the via and the overflow groove are provided with a soldering material;

wherein a first copper plating layer is provided on a side of the cover layer that is away from the soldering surface;

wherein a groove depth of the overflow groove is less than a thickness of the cover layer, a second copper plating layer is provided on a groove bottom of the overflow groove and a groove wall of the overflow groove that is close to the via, and the second copper plating layer is connected to the first copper plating layer.

10. The display panel of claim 9, wherein the overflow groove is an annular groove, and a distance between a first point on an inner ring edge of the annular groove and a second point on the edge of the via that is closest to the first point is the first distance.

11. The display panel of claim 9, wherein the first distance is equal to or greater than 0.3 mm, and the overflow groove has a groove width of at least 0.2 mm.

12. The display panel of claim 9, wherein a third copper plating layer is provided on an inner wall of the via, and the third copper plating layer is connected to the first copper plating layer.

13. The display panel of claim 9, wherein a cross-sectional shape of the overflow groove is any one of: a rectangle, a trapezoid, or an arc shape.

14. The display panel of claim 9, wherein the via is circular in shape and the overflow groove is an annular overflow groove having a same center as the circular via.

15. The display panel of claim 9, wherein the via is square in shape and the overflow groove is a linear overflow groove or a square ring.

* * * * *